(12) United States Patent
Muhn

(10) Patent No.: US 10,658,731 B2
(45) Date of Patent: May 19, 2020

(54) ANTENNA DEVICE AND ELECTRONIC DEVICE COMPRISING SAME

(71) Applicant: Samsung Electronics Co., Ltd., Gyeonggi-do (KR)

(72) Inventor: Sung Jin Muhn, Gyeonggi-do (KR)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/778,772

(22) PCT Filed: Nov. 17, 2016

(86) PCT No.: PCT/KR2016/013259
§ 371 (c)(1),
(2) Date: May 24, 2018

(87) PCT Pub. No.: WO2017/090936
PCT Pub. Date: Jun. 1, 2017

(65) Prior Publication Data
US 2018/0351237 A1    Dec. 6, 2018

(30) Foreign Application Priority Data

Nov. 25, 2015 (KR) .......................... 10-2015-0165488

(51) Int. Cl.
*H01Q 1/24* (2006.01)
*H01Q 21/28* (2006.01)
(Continued)

(52) U.S. Cl.
CPC ............. *H01Q 1/243* (2013.01); *H01Q 1/245* (2013.01); *H01Q 1/44* (2013.01); *H01Q 13/10* (2013.01); *H01Q 21/28* (2013.01)

(58) Field of Classification Search
CPC .......... H01Q 1/243; H01Q 1/44; H01Q 13/10; H01Q 13/18
See application file for complete search history.

(56) References Cited

U.S. PATENT DOCUMENTS 10,001,885 B2   6/2018   Pance et al.
10,312,593 B2   6/2019   Yarga et al.
(Continued)

FOREIGN PATENT DOCUMENTS

CN   102713811 A   10/2012
CN   104167592 A   11/2014
(Continued)

OTHER PUBLICATIONS

European Search Report dated Oct. 22, 2018.
Chinese Search Report dated Oct. 30, 2019.

*Primary Examiner* — Robert Karacsony
(74) *Attorney, Agent, or Firm* — Cha & Reiter, LLC

(57) ABSTRACT

According to various embodiments, there may be provided an electronic device including a housing having a plurality of sides, a first conductive member constructing at least part of the plurality of sides, a second conductive member disposed inside the housing, a first sensor circuit which provides a first output indicating a first capacitance value related to the first conductive member and/or a change to the first capacitance value, a second sensor circuit which provides a second output indicating a second capacitance value related to the second conductive member and/or a change to the second capacitance value, and a control circuit which receives the first and second outputs from the first and second sensor circuits. In addition, other embodiments are also possible.

13 Claims, 11 Drawing Sheets

(51) Int. Cl.
*H01Q 13/10* (2006.01)
*H01Q 1/44* (2006.01)

(56) References Cited

U.S. PATENT DOCUMENTS

| | | |
|---|---|---|
| 2010/0285759 A1 | 11/2010 | Chung et al. |
| 2011/0012793 A1 | 1/2011 | Amm et al. |
| 2011/0248952 A1 | 10/2011 | Wang et al. |
| 2012/0092221 A1 | 4/2012 | Schlub et al. |
| 2013/0300618 A1 | 11/2013 | Yarga et al. |
| 2014/0218244 A1 | 8/2014 | Chang et al. |
| 2014/0361979 A1 | 12/2014 | Woo et al. |
| 2015/0200444 A1 | 7/2015 | Mercer et al. |
| 2015/0270619 A1* | 9/2015 | Zhu ............... G01V 3/00 343/702 |
| 2015/0303568 A1* | 10/2015 | Yarga ............ H01Q 5/321 343/720 |

FOREIGN PATENT DOCUMENTS

| | | |
|---|---|---|
| CN | 204481122 U | 7/2015 |
| CN | 105874647 A | 8/2016 |
| CN | 105940548 A | 9/2016 |
| JP | 2012-129762 A | 7/2012 |
| JP | 2014-165659 A | 9/2014 |
| KR | 10-2009-0076630 A | 7/2009 |
| KR | 10-2010-0120485 A | 11/2010 |
| KR | 10-2014-0142862 A | 12/2014 |
| WO | 2015/138248 A1 | 9/2015 |

* cited by examiner

ANTENNA DEVICE AND ELECTRONIC DEVICE COMPRISING SAME

CLAIM OF PRIORITY

This application is a National Phase Entry of PCT International Application No. PCT/KR2016/013259, which was filed on Nov. 17, 2016, and claims a priority to Korean Patent Application No. 10-2015-0165488, which was filed on Nov. 25, 2015 the contents of which are incorporated herein by reference.

TECHNICAL FIELD

Various embodiments of the present disclosure relate to an electronic device including an antenna device.

BACKGROUND ART

With the development of electronic communication technologies, electronic devices having various functions have recently been introduced. In general, the electronic devices have various functions which complexly perform one or more functions.

Recently, with a significant decrease in a functional gap of each manufacturer, electronic devices have become slimmer to satisfy purchasing needs of consumers, and there is an effort to improve rigidity of the electronic device and to make it slim while enhancing a design aspect. As one way of such a trend, there is a competition to prevent radiation performance deterioration and exhibit excellent performance while efficiently securing a space for disposing at least one antenna device which must be essentially provided for communication among components of the electronic device.

DISCLOSURE OF INVENTION

Technical Problem

According to various embodiments, an antenna device used in an electronic device has an Inverted-F Antenna (IFA) or a monopole radiator as a basic structure, and a volume and the number of antennas to be mounted may be determined according to a service frequency, bandwidth, and type. For example, although a frequency is different in each region around the world, a low band of 700 MHz to 900 MHz, a mid band of 1700 MHz to 2100 MHz, a high band of 2300 MHz to 2700 MHz, and the like are used typically as a primary communication band. In addition, various wireless communication services such as Bluetooth (BT), Global Positioning System (GPS), and Wireless Fidelity (WIFI) may be used. In order to support the aforementioned communication bands, a plurality of antennas are required, whereas a communication device may have a limited space for an antenna volume. To avoid this, it may be designed such that service bands having similar frequency bands are grouped together and are separated into several antennas.

According to various embodiments, the electronic device may include a conductive member (e.g., a housing, a metal frame, a metal bezel, etc.) to achieve rigidity reinforcement and implement a good external design. According to an embodiment, the conductive member may be used to perform various functions which can be performed in the electronic device in addition to the aforementioned functions. For example, gradually, in response to a request for making the electronic device slim, the conductive member may be used as a grip sensor while being used as a multi-band antenna radiator (e.g., a hybrid antenna or the like associated with a slot antenna and a Printed Circuit Board (PCB) antenna) operating in a plurality of frequency bands.

According to various embodiments, when at least some regions of the conductive member which is substantially disposed to an entire region of the electronic device are used as the antenna radiator and the grip sensor, the conductive member may operate as the grip sensor even if a body is in contact with an undesired region (e.g., a region to which the antenna is not disposed) of the electronic device. An unintended grip sensing operation may cause Transmit (Tx) power backoff of the antenna, thereby degrading communication quality.

According to various embodiments, there may be provided an antenna device and an electronic device including the antenna device.

Solution to Problem

According to various embodiments, there may be provided an electronic device including a housing having a plurality of sides, a first conductive member constructing at least part of the plurality of sides, a second conductive member disposed inside the housing, a first sensor circuit which provides a first output indicating a first capacitance value related to the first conductive member and/or a change to the first capacitance value, a second sensor circuit which provides a second output indicating a second capacitance value related to the second conductive member and/or a change to the second capacitance value, and a control circuit which receives the first and second outputs from the first and second sensor circuits.

Advantageous Effects of Invention

According to various embodiments, since an electronic device including a non-segmented first conductive member includes a separate second conductive member for grip sensing, a sensing operation can be correctly recognized in a desired region of the electronic device, thereby effectively performing a corresponding function (e.g., Transmit (Tx) power control or the like of an antenna).

BEST MODE FOR CARRYING OUT THE INVENTION

Figure 1:
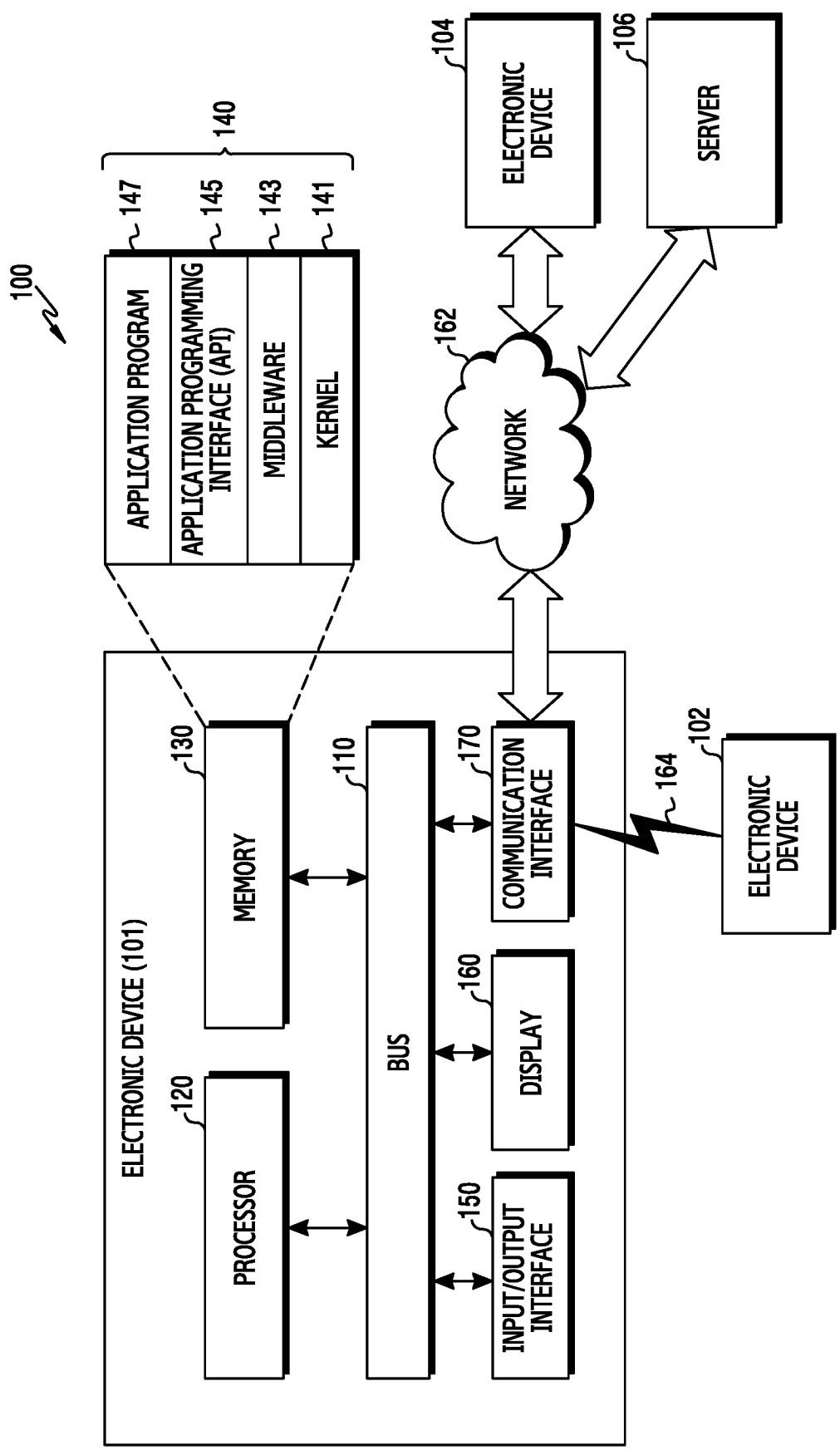
FIG. 1 illustrates a network environment including an electronic device according to various embodiments of the present disclosure.

Hereinafter, various exemplary embodiments of the present document are described with reference to the accompanying drawings. It should be understood, however, that it is not intended to limit the exemplary embodiments of the present document to the particular form disclosed, but, on the contrary, it is intended to cover all modifications, equivalents, and alternatives falling within the spirit and scope of the exemplary embodiments of the present document. Like reference numerals denote like constitutional elements throughout the drawings.

An expression "have", "may have", "include" or "may include" or the like used in the present document is intended to indicate a presence of a corresponding characteristic (e.g., a number, a function, an operation, or a constitutional element such as a component), and should be understood that there are additional possibilities of one or more other characteristics.

In the present document, an expression "A or B", "A and/or B", or "one or more of A and/or B" or the like may include all possible combinations of items enumerated together. For example, "A or B", "at least one of A and B", or "at least one of A or B" may indicate all cases where: (1) at least one A is included; (2) at least one B is included; and (3) at least one A and at least one B are both included.

Although expressions such as "$1^{st}$", "$2^{nd}$", "first", and "second" may be used in the present document to express various constitutional elements, it is not intended to limit the corresponding constitutional elements. For example, the above expressions may be used to distinguish one constitutional element from another constitutional element. For example, a $1^{st}$ user device and a $2^{nd}$ user device are both user devices, and indicate different user devices. For example, a $1^{st}$ constitutional element may be termed a $2^{nd}$ constitutional element, and similarly, the $2^{nd}$ constitutional element may be termed the $1^{st}$ constitutional element without departing from the scope of the present document.

When a certain constitutional element (e.g., the $1^{st}$ constitutional element) is mentioned as being "operatively or communicatively coupled with/to" or "connected to" a different constitutional element (e.g., the $2^{nd}$ constitutional element), it is to be understood that the certain constitutional element is directly coupled with/to another constitutional element or can be coupled with/to the different constitutional element via another constitutional element (e.g., a $3^{rd}$ constitutional element). On the other hand, when the certain constitutional element (e.g., the $1^{st}$ constitutional element) is mentioned as being "directly coupled with/to" or "directly connected to" the different constitutional element (e.g., the $2^{nd}$ constitutional element), it may be understood that another constitutional element (e.g., the $3^{rd}$ constitutional element) is not present between the certain constitutional element and the different constitutional element.

An expression "configured to" used in the present document may be interchangeably used with, for example, "suitable for", "having the capacity to", "designed to", "adapted to", "made to", or "capable of" according to a situation. A term "configured to" may not imply only "specially designed to" in a hardware manner. Instead, in a certain situation, an expressed "a device configured to" may imply that the device is "capable of" together with other devices or components. For example, "a processor configured to perform A, B, and C" may imply a dedicated processor (e.g., an embedded processor) for performing a corresponding operation or a generic-purpose processor (e.g., Central Processing Unit (CPU) or an Application Processor (AP)) capable of performing corresponding operations by executing one or more software programs stored in a memory device.

Terms used in the present document are for the purpose of describing particular embodiments only and are not intended to limit other exemplary embodiments. A singular expression may include a plural expression unless there is a contextually distinctive difference. Unless otherwise defined, all terms (including technical and scientific terms) used herein have the same meaning as commonly understood by those ordinarily skilled in the art disclosed in the present document. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Optionally, the terms defined in the present document should not be interpreted to exclude the exemplary embodiments of the present document.

An electronic device according to various exemplary embodiments of the present document may include, for example, at least one of a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device. According to various exemplary embodiments, the wearable device may include at least one of an accessory-type device (e.g., a watch, a ring, a bracelet, an anklet, a necklace, glasses, contact lenses, or a Head-Mounted Device (HMD)), a fabric- or clothes-integrated device (e.g., electronic clothes), a body attaching-type device (e.g., a skin pad or tattoo), or a body implantable device (e.g., an implantable circuit).

According to certain exemplary embodiments, the electronic device may be a home appliance. The home appliance may include, for example, at least one of a TeleVision (TV), a Digital Video Disk (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™, PlayStation™), an electronic dictionary, an electronic key, a camcorder, and an electronic picture frame.

According to other exemplary embodiments, the electronic device may include at least one of various medical devices (e.g., various portable medical measuring devices (e.g., a blood sugar measuring device, a hear rate measuring device, a blood pressure measuring device, a body temperature measuring device, etc.), Magnetic Resonance Angiography (MRA), Magnetic Resonance Imaging (MRI), Computed Tomography (CT), imaging equipment, ultrasonic instrument, etc.)), a navigation device, a Global Navigation Satellite System (GNSS), an Event Data Recorder (EDR), a Flight Data Recorder (FDR), a car infotainment device, an electronic equipment for ship (e.g., a vessel navigation device, a gyro compass, etc.), avionics, a security device, a car head unit, an industrial or domestic robot, an Automatic Teller's Machine (ATM) of financial institutions, Point Of Sales (POS) of shops, and Internet of things (e.g., a light bulb, various sensors, an electric or gas meter, a sprinkler device, a fire alarm, a thermostat, a streetlamp, a toaster, a fitness equipment, a hot water tank, a heater, a boiler, etc.).

According to certain exemplary embodiments, the electronic device may include at least one of furniture or a part of buildings/constructions, an electronic board, an electronic signature input device, a projector, and various measurement machines (e.g., water supply, electricity, gas, propagation measurement machine, etc.). In various exemplary embodiments, the electronic device may be one or more combinations of the aforementioned various devices. According to certain exemplary embodiments, the electronic device may be a flexible device. Further, the electronic device according to an exemplary embodiment of the present document is not limited to the aforementioned devices, and may include a new electronic device depending on technical progress.

Hereinafter, an electronic device according to various exemplary embodiments will be described with reference to the accompanying drawings. The term "user" used in the present document may refer to a person who uses the electronic device or a device which uses the electronic device (e.g., an Artificial Intelligence (AI) electronic device).

FIG. 1 illustrates a network environment including an electronic device according to various exemplary embodiments.

Referring to FIG. 1, an electronic device 101 in a network environment 100 is disclosed according to various exemplary embodiments. The electronic device 101 may include a bus 110, a processor 120, a memory 130, an input/output interface 150, a display 160, and a communication interface 170. In a certain exemplary embodiment, the electronic device 101 may omit at least one of the aforementioned constitutional elements or may additionally include other constitutional elements.

The bus 110 may include a circuit for connecting the aforementioned constitutional elements 110 to 170 to each other and for delivering communication (e.g., a control message and/or data) between the aforementioned constitutional elements.

The processor 120 may include one or more of a Central Processing Unit (CPU), an Application Processor (AP), and a Communication Processor (CP). The processor 120 may control, for example, at least one of other constitutional elements of the electronic device 101 and/or may execute an arithmetic operation or data processing for communication.

The memory 130 may include a volatile and/or non-volatile memory. The memory 130 may store, for example, an instruction or data related to at least one different constitutional element of the electronic device 101. According to various exemplary embodiments, the memory 130 may store a software and/or a program 140. The program 140 may include, for example, a kernel 141, a middleware 143, an Application Programming Interface (API) 145, and/or an application program (or an "application") 147, or the like. At least one part of the kernel 141, middleware 143, or API 145 may be referred to as an Operating System (OS).

The kernel 141 may control or manage, for example, system resources (e.g., the bus 110, the processor 120, the memory 130, etc.) used to execute an operation or function implemented in other programs (e.g., the middleware 143, the API 145, or the application program 147). Further, the kernel 141 may provide an interface capable of controlling or managing the system resources by accessing individual constitutional elements of the electronic device 101 in the middleware 143, the API 145, or the application program 147.

The middleware 143 may perform, for example, a mediation role so that the API 145 or the application program 147 can communicate with the kernel 141 to exchange data.

Further, the middleware 143 may handle one or more task requests received from the application program 147 according to a priority. For example, the middleware 143 may assign a priority of using the system resources (e.g., the bus 110, the processor 120, or the memory 130) of the electronic device 101 to at least one of the application programs 147. For instance, the middleware 143 may process the one or more task requests according to the priority assigned to the at least one of the application programs, and thus may perform scheduling or load balancing on the one or more task requests.

The API 145 may include at least one interface or function (e.g., instruction), for example, for file control, window control, video processing, or character control, as an interface capable of controlling a function provided by the application 147 in the kernel 141 or the middleware 143.

For example, the input/output interface 150 may play a role of an interface for delivering an instruction or data input from a user or a different external device(s) to the different constitutional elements of the electronic device 101. Further, the input/output interface 150 may output an instruction or data received from the different constitutional element(s) of the electronic device 101 to the different external device.

The display 160 may include various types of displays, for example, a Liquid Crystal Display (LCD) display, a Light Emitting Diode (LED) display, an Organic Light-Emitting Diode (OLED) display, a MicroElectroMechanical Systems (MEMS) display, or an electronic paper display. The display 160 may display, for example, a variety of contents (e.g., text, image, video, icon, symbol, etc.) to the user. The display 160 may include a touch screen. For example, the display 160 may receive a touch, gesture, proximity, or hovering input by using a stylus pen or a part of a user's body.

The communication interface 170 may establish, for example, communication between the electronic device 101 and the external device (e.g., a $1^{st}$ external electronic device 102, a $2^{nd}$ external electronic device 104, or a server 106). For example, the communication interface 170 may communicate with the external device (e.g., the $2^{nd}$ external electronic device 104 or the server 106) by being connected to a network 162 through wireless communication or wired communication.

For example, as a cellular communication protocol, the wireless communication may use at least one of Long-Term Evolution (LTE), LTE Advance (LTE-A), Code Division Multiple Access (CDMA), Wideband CDMA (WCDMA), Universal Mobile Telecommunications System (UMTS), Wireless Broadband (WiBro), Global System for Mobile Communications (GSM), and the like. Further, the wireless communication may include, for example, a near-distance communication 164. The near-distance communication 164 may include, for example, at least one of Wireless Fidelity (WiFi), Bluetooth, Near Field Communication (NFC), Global Navigation Satellite System (GNSS), and the like. According to a usage region or a bandwidth or the like, the GNSS may include, for example, at least one of Global Positioning System (GPS), Global Navigation Satellite System (Glonass), Beidou Navigation Satellite System (hereinafter, "Beidou"), Galileo, the European global satellite-based navigation system, and the like. Hereinafter, the "GPS" and the "GNSS" may be used interchangeably in the present document. The wired communication may include, for example, at least one of Universal Serial Bus (USB), High Definition Multimedia Interface (HDMI), Recommended Standard-232 (RS-232), power-line communication, Plain Old Telephone Service (POTS), and the like. The network 162 may include, for example, at least one of a telecommunications network, a computer network (e.g., LAN or WAN), the Internet, and a telephone network.

Each of the $1^{st}$ and $2^{nd}$ external electronic devices 102 and 104 may be the same type or different type of the electronic device 101. According to one exemplary embodiment, the server 106 may include a group of one or more servers. According to various exemplary embodiments, all or some of operations executed by the electronic device 101 may be executed in a different one or a plurality of electronic devices (e.g., the electronic device 102 or 104 or the server 106). According to one exemplary embodiment, if the electronic device 101 needs to perform a certain function or service either automatically or at a request, the electronic device 101 may request at least some parts of functions related thereto alternatively or additionally to a different electronic device (e.g., the electronic device 102 or 104 or the server 106) instead of executing the function or the service autonomously. The different electronic device (e.g., the electronic device 102 or 104 or the server 106) may execute the requested function or additional function, and may deliver a result thereof to the electronic device 101. The electronic device 101 may provide the requested function or service either directly or by additionally processing the received result. For this, for example, a cloud computing, distributed computing, or client-server computing technique may be used.

Figure 2:
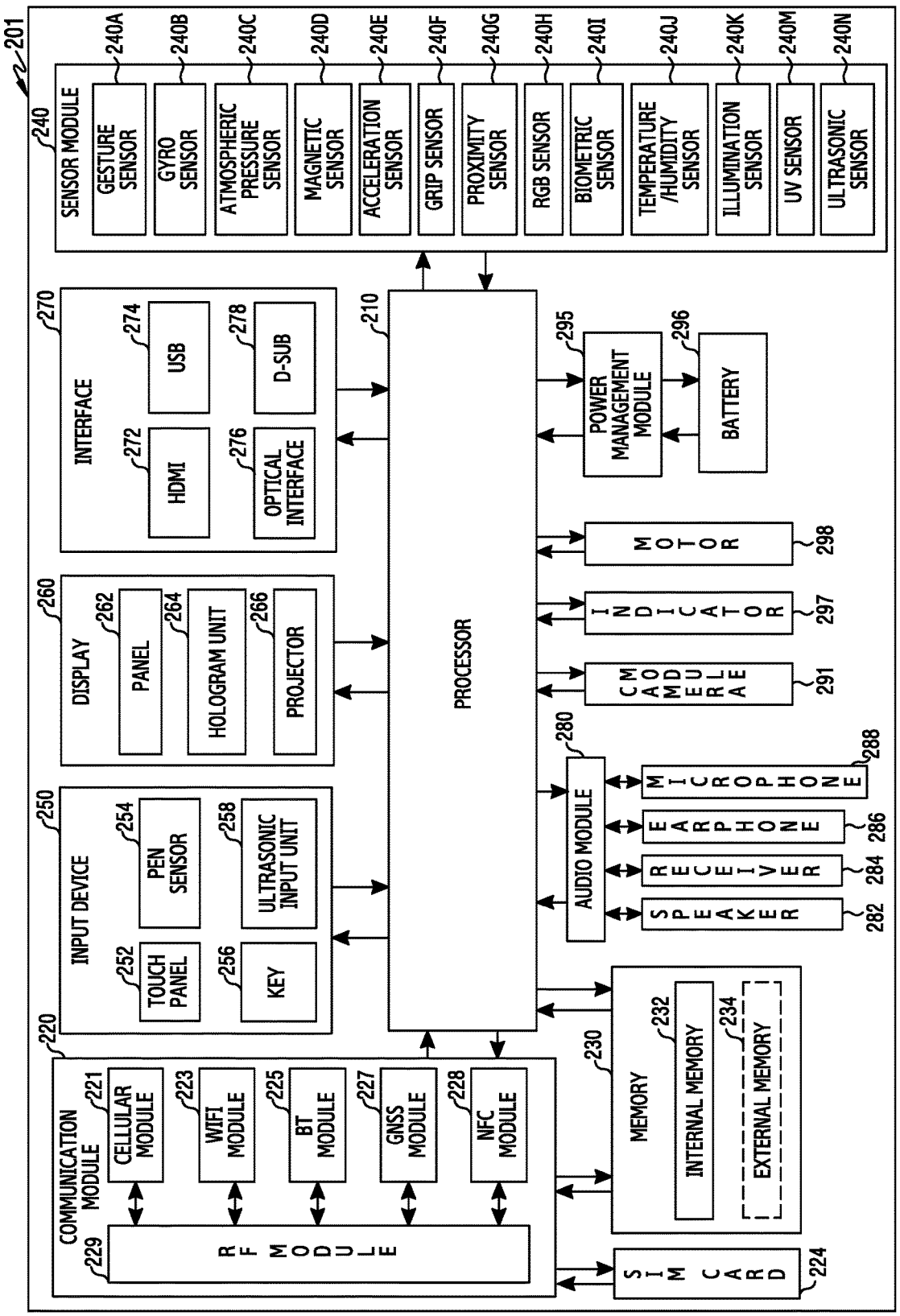
FIG. 2 is a block diagram of an electronic device according to various embodiments of the present disclosure.

FIG. 2 is a block diagram of an electronic device according to various exemplary embodiments.

An electronic device 201 may include, for example, all or some parts of the electronic device 101 of FIG. 1. The electronic device 201 may include one or more processors (e.g., Application Processors (APs)) 210, a communication module 220, a subscriber identity module 224, a memory 230, a sensor module 240, an input unit 250, a display 260, an interface 270, an audio module 280, a camera unit 291, a power management module 295, a battery 296, an indicator 297, and a motor 298.

The processor 210 may control a plurality of hardware or software constitutional elements connected to the processor 210 by driving, for example, an operating system or an application program, and may process a variety of data including multimedia data and may perform an arithmetic operation. The processor 210 may be implemented, for example, with a System on Chip (SoC). According to one exemplary embodiment, the processor 210 may further include a Graphic Processing Unit (GPU) and/or an Image Signal Processor (ISP). The processor 210 may include at least one part (e.g., a cellular module 221) of the aforementioned constitutional elements of FIG. 2. The processor 210 may process an instruction or data, which is received from at least one of different constitutional elements (e.g., a non-volatile memory), by loading it to a volatile memory and may store a variety of data in the non-volatile memory.

The communication module 220 may have a structure the same as or similar to the communication interface 170 of FIG. 1. The communication module 220 may include, for example, the cellular module 221, a Wi-Fi module 223, a BlueTooth (BT) module 225, a GNSS module 227 (e.g., a GPS module, a Glonass module, a Beidou module, or a Galileo module), a Near Field Communication (NFC) module 228, and a Radio Frequency (RF) module 229.

The cellular module 221 may provide a voice call, a video call, a text service, an Internet service, or the like, for example, through a communication network. According to one exemplary embodiment, the cellular module 221 may identify and authenticate the electronic device 201 in the communication network by using the subscriber identity module (e.g., a Subscriber Identity Module (SIM) card) 224. According to one exemplary embodiment, the cellular module 221 may perform at least some functions that can be provided by the processor 210. According to one exemplary embodiment, the cellular module 221 may include a Communication Processor (CP).

Each of the WiFi module 223, the BT module 225, the GNSS module 227, or the NFC module 228 may include, for example, a processor for processing data transmitted/received via a corresponding module. According to a certain exemplary embodiment, at least some (e.g., two or more) of the cellular module 221, the WiFi module 223, the BT module 225, the GPS module 227, and the NFC module 228 may be included in one Integrated Chip (IC) or IC package.

The RF module 229 may transmit/receive, for example, a communication signal (e.g., a Radio Frequency (RF) signal). The RF module 229 may include, for example, a transceiver, a Power Amp Module (PAM), a frequency filter, a Low Noise Amplifier (LNA), an antenna, or the like. According to another exemplary embodiment, at least one of the cellular module 221, the WiFi module 223, the BT module 225, the GPS module 227, and the NFC module 228 may transmit/receive an RF signal via a separate RF module.

The subscriber identity module 224 may include, for example, a card including the subscriber identity module and/or an embedded SIM, and may include unique identification information (e.g., an Integrated Circuit Card IDentifier (ICCID)) or subscriber information (e.g., an International Mobile Subscriber Identity (IMSI)).

The memory 230 (e.g., the memory 130) may include, for example, an internal memory 232 or an external memory 234. The internal memory 232 may include, for example, at least one of a volatile memory (e.g., a Dynamic RAM (DRAM), a Static RAM (SRAM), a Synchronous Dynamic RAM (SDRAM), etc.) and a non-volatile memory (e.g., a One Time Programmable ROM (OTPROM), a Programmable ROM (PROM), an Erasable and Programmable ROM (EPROM), an Electrically Erasable and Programmable ROM (EEPROM), a mask ROM, a flash ROM, a flash memory (e.g., a NAND flash memory, a NOR flash memory, etc.), a hard drive, or a Solid State Drive (SSD)).

The external memory 234 may further include a flash drive, for example, Compact Flash (CF), Secure Digital (SD), Micro Secure Digital (Micro-SD), Mini Secure digital (Mini-SD), extreme Digital (xD), memory stick, or the like. The external memory 234 may be operatively and/or physically connected to the electronic device 201 via various interfaces.

The sensor module 240 may measure, for example, physical quantity or detect an operational status of the electronic device 201, and may convert the measured or detected information into an electric signal. The sensor module 240 may include, for example, at least one of a gesture sensor 240A, a gyro sensor 240B, a pressure sensor 240C, a magnetic sensor 240D, an acceleration sensor 240E, a grip sensor 240F, a proximity sensor 240G, a color sensor 240H (e.g., a Red, Green, Blue (RGB) sensor), a bio sensor 240I, a temperature/humidity sensor 240J, an illumination sensor 240K, an Ultra Violet (UV) sensor 240M, and an ultrasonic sensor 240N. Additionally or alternatively, the sensor module 240 may include, for example, an E-nose sensor, an ElectroMyoGraphy (EMG) sensor, an ElectroEncephaloGram (EEG) sensor, an ElectroCardioGram (ECG) sensor, an Infrared (IR) sensor, an iris sensor, and/or a fingerprint sensor. The sensor module 240 may further include a control circuit for controlling at least one or more sensors included therein. In a certain exemplary embodiment, the electronic device 201 may further include a processor configured to control the sensor module 204 either separately or as one part of the processor 210, and may control the sensor module 240 while the processor 210 is in a sleep state.

The input device 250 may include, for example, a touch panel 252, a (digital) pen sensor 254, a key 256, or an ultrasonic input device 258. The touch panel 252 may recognize a touch input, for example, by using at least one of an electrostatic type, a pressure-sensitive type, and an ultrasonic type. In addition, the touch panel 252 may further include a control circuit. The touch penal 252 may further include a tactile layer and thus may provide the user with a tactile reaction.

The (digital) pen sensor 254 may be, for example, one part of a touch panel, or may include an additional sheet for recognition. The key 256 may be, for example, a physical button, an optical key, a keypad, or a touch key. The ultrasonic input device 258 may detect an ultrasonic wave generated from an input means through a microphone (e.g., a microphone 288) to confirm data corresponding to the detected ultrasonic wave.

The display 260 (e.g., the display 160) may include a panel 262, a hologram unit 264, or a projector 266. The panel 262 may include a structure the same as or similar to the display 160 of FIG. 1. The panel 262 may be implemented, for example, in a flexible, transparent, or wearable manner. The panel 262 may be constructed as one module with the touch panel 252. According to one exemplary embodiment, the panel 262 may include a pressure sensor (or a force sensor) capable of measuring strength of pressure for a user's touch. The pressure sensor may be implemented in an integral form with respect to the touch panel 252, or may be implemented as one or more sensors separated from the touch panel 252. The hologram unit 264 may use an interference of light and show a stereoscopic image in the air. The projector 266 may display an image by projecting a light beam onto a screen. The screen may be located, for example, inside or outside the electronic device 201. According to one exemplary embodiment, the display 260 may further include a control circuit for controlling the panel 262, the hologram unit 264, or the projector 266.

The interface 270 may include, for example, a High-Definition Multimedia Interface (HDMI) 272, a Universal Serial Bus (USB) 274, an optical communication interface 276, or a D-subminiature (D-sub) 278. The interface 270 may be included, for example, in the communication interface 170 of FIG. 1. Additionally or alternatively, the interface 270 may include, for example, a Mobile High-definition Link (MHL) interface, a Secure Digital (SD)/MultiMedia Card (MMC) interface, or an Infrared Data Association (IrDA) standard interface.

The audio module 280 may bilaterally convert, for example, a sound and electric signal. At least some constitutional elements of the audio module 280 may be included in, for example, the input/output interface 150 of FIG. 1. The audio module 280 may convert sound information which is input or output, for example, through a speaker 282, a receiver 284, an earphone 286, the microphone 288, or the like.

The camera module 291 is, for example, a device for image and video capturing, and according to one exemplary embodiment, may include one or more image sensors (e.g., a front sensor or a rear sensor), a lens, an Image Signal Processor (ISP), or a flash (e.g., LED or xenon lamp).

The power management module 295 may manage, for example, power of the electronic device 201. According to one exemplary embodiment, the power management module 295 may include a Power Management Integrated Circuit (PMIC), a charger Integrated Circuit (IC), or a battery fuel gauge. The PMIC may have a wired and/or wireless charging type. The wireless charging type may include, for example, a magnetic resonance type, a magnetic induction type, an electromagnetic type, or the like, and may further include an additional circuit for wireless charging, for example, a coil loop, a resonant circuit, a rectifier, or the like. The battery gauge may measure, for example, residual quantity of the battery 296 and voltage, current, and temperature during charging. The battery 296 may include, for example, a rechargeable battery and/or a solar battery.

The indicator 297 may display a specific state, for example, a booting state, a message state, a charging state, or the like, of the electronic device 201 or one part thereof (e.g., the processor 210). The motor 298 may convert an electric signal into a mechanical vibration, and may generate a vibration or haptic effect. Although not shown, the electronic device 201 may include a processing device (e.g., a GPU) for supporting a mobile TV. The processing device for supporting the mobile TV may process media data conforming to a protocol of, for example, Digital Multimedia Broadcasting (DMB), Digital Video Broadcasting (DVB), MediaFlo™, or the like.

Each of constitutional elements described in the present document may consist of one or more components, and names thereof may vary depending on a type of an electronic device. The electronic device according to various exemplary embodiments may include at least one of the constitutional elements described in the present document. Some of the constitutional elements may be omitted, or additional other constitutional elements may be further included. Further, some of the constitutional elements of the electronic device according to various exemplary embodiments may be combined and constructed as one entity, so as to equally perform functions of corresponding constitutional elements before combination.

In the description of the present disclosure, a conductive member utilized as an antenna radiator is used as at least part of a housing, and although a metal bezel disposed along an edge of the electronic device is described for example, the conductive member is not limited thereto. For example, various metal constructions included in the electronic device may also be utilized as the antenna radiator. According to an embodiment, the electronic device applied in an exemplary embodiment of the present disclosure is a bar-type electronic device, but is not limited thereto. For example, the electronic device may be an electronic device having various opening and closing mechanisms or a wearable electronic device.

Figure 3:
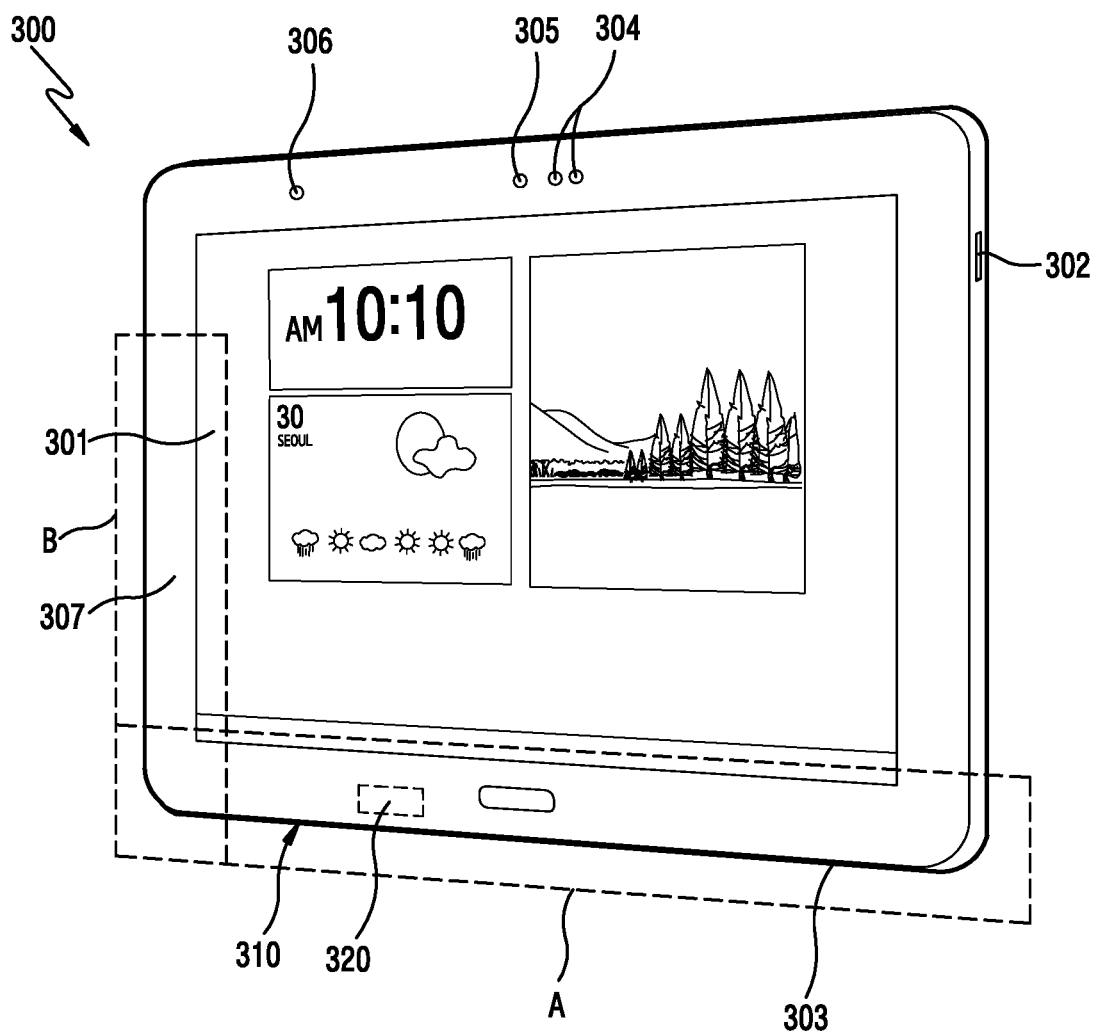
FIG. 3 is a perspective view of an electronic device according to various embodiments of the present disclosure.

FIG. 3 is a perspective view of an electronic device 300 according to various embodiments of the present disclosure.

Referring to FIG. 3, a display 301 may be included in a front side 307 of the electronic device 300. At least one speaker device 302 may be disposed to a lateral side of the display 301. However, without being limited thereto, the speaker device may be disposed to various positions such as a front side, rear side, or the like of the electronic device. A microphone 303 may be disposed to a lower side of the display 301 to transmit a voice of a user of the electronic device to a peer user. According to an embodiment, the display 301 may include a touch display including a touch sensor (a contact-type touch sensor or a non-contact-type touch sensor (digitizer)). According to an embodiment, the display 301 may be configured to detect external force applied to a surface of the display 301 by including a force sensor. According to an embodiment, the electronic device 300 may perform a corresponding function based on the external force detected in the display 301.

According to an embodiment, components for performing various functions of the electronic device 300 may be disposed to an upper portion of the display 301. The components may include at least one sensor module 304. The sensor module 304 may include, for example, at least one of an illumination sensor (e.g., an optical sensor), a proximity sensor, an infrared sensor, an iris sensor, and an ultrasonic sensor. According to an embodiment, the component may include a camera device 305. According to an embodiment, the component may include an LED indicator 306 for informing the user of status information of the electronic device 300.

According to various embodiments, the electronic device 300 may include a first conductive member 310 (e.g., a metal frame, a metal bezel, etc.). According to an embodiment, the first conductive member 310 may include a metal frame or metal bezel of the electronic device. For example, an edge of the metal frame or metal bezel may be at least partially exposed to the outside of the electronic device to implement a good external appearance. According to an embodiment, at least some regions of the first conductive member 310 may be utilized as an antenna radiator. The region may be a region A and/or region B of FIG. 4. However, without being limited thereto, a region of the first conductive member 310 implemented as the antenna radiator may also be disposed to the remaining edge regions of the electronic device.

According to various embodiments, at least some regions of the first conductive member 310 may operate as a slot antenna depending on a slot region having a length constructed inwardly along the edge. According to an embodiment, a second conductive member 320 may be included around a region contributed as an antenna of the first conductive member 310. According to an embodiment, the first conductive member 310 and the second conductive member 320 may be electrically coupled to a sensor module (e.g., a grip sensor module, etc.) of the electronic device 300. According to an embodiment, the electronic device 300 may detect an object (e.g., a human body, etc.) in contact with or proximate to a portion around the first conductive member 310 and the second conductive member 320 through the sensor module. According to an embodiment, the electronic device 300 may achieve Transmit (Tx) power backoff upon sensing a body contact in a region to which the antenna is disposed. According to an embodiment, the electronic device 300 may maintain Tx power upon sensing the body contact in the region to which the antenna is disposed. According to an embodiment, upon sensing the body contact in a specific region among regions other than an antenna region, the electronic device 300 may detect a capacitance variation of the region and may perform a corresponding function by comparing the detected capacitance variation with a table stored in a memory of the electronic device. According to an embodiment, the corresponding function may execute at least one application program only by touching a specific external region of the electronic device by the user. According to an embodiment, the electronic device 300 may execute a camera program or capture a subject only by sensing a touch of a specific external region.

According to various embodiments, a region for applying the antenna of the first conductive member may be used as a sensor for grip sensing. However, without being limited thereto, the first conductive member may be utilized as an electrocardiogram sensor, a typical touch sensor, a temperature sensor (e.g., a probe for a temperature sensor) or an underwater sensor (e.g., an immersion sensor).

Hereinafter, an antenna device according to an exemplary embodiment of the present disclosure will be described in detail.

Figure 4A:
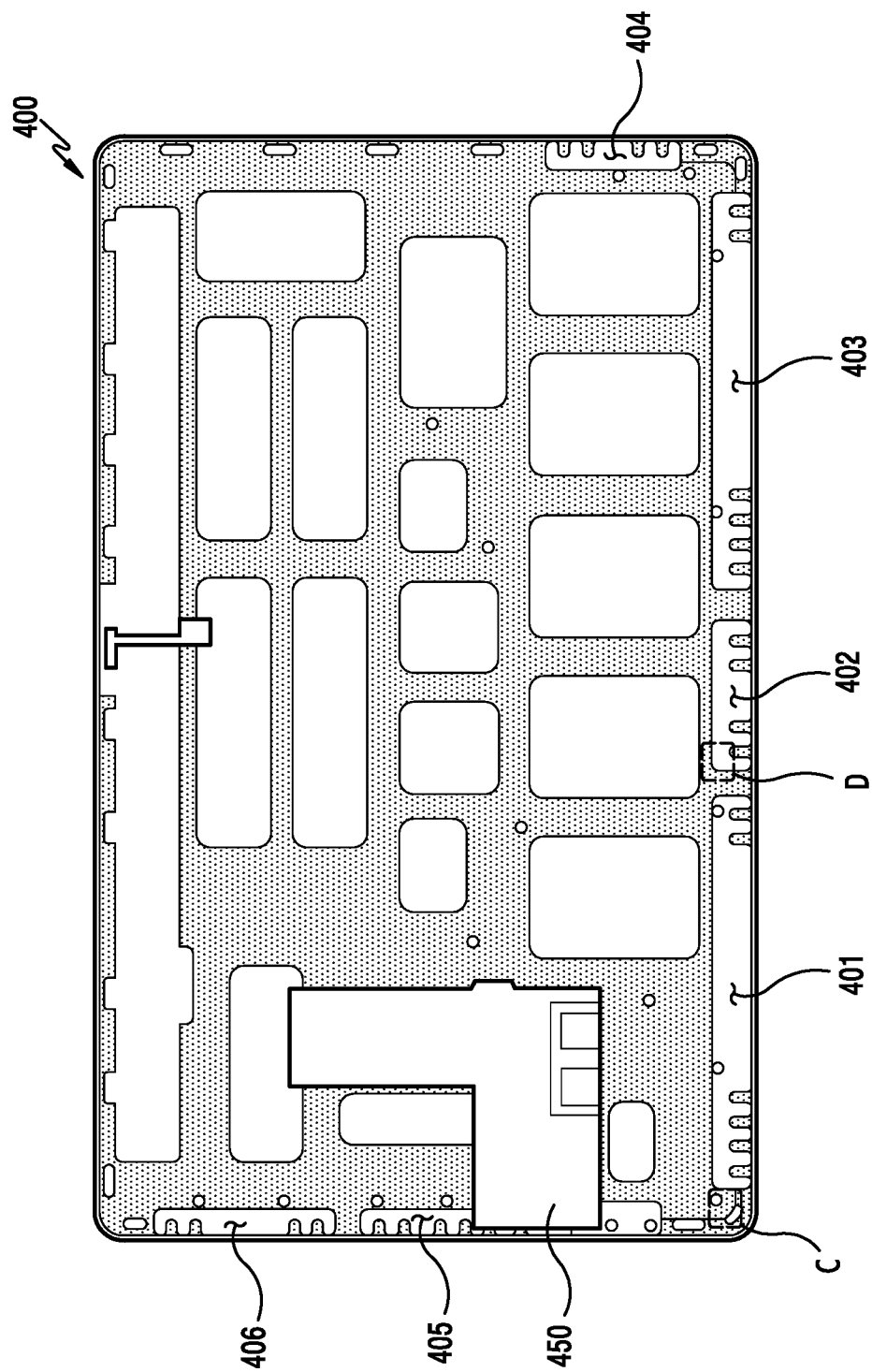
FIG. 4A illustrates a structure of a first conductive member according to various embodiments of the present disclosure.
Figure 4B:
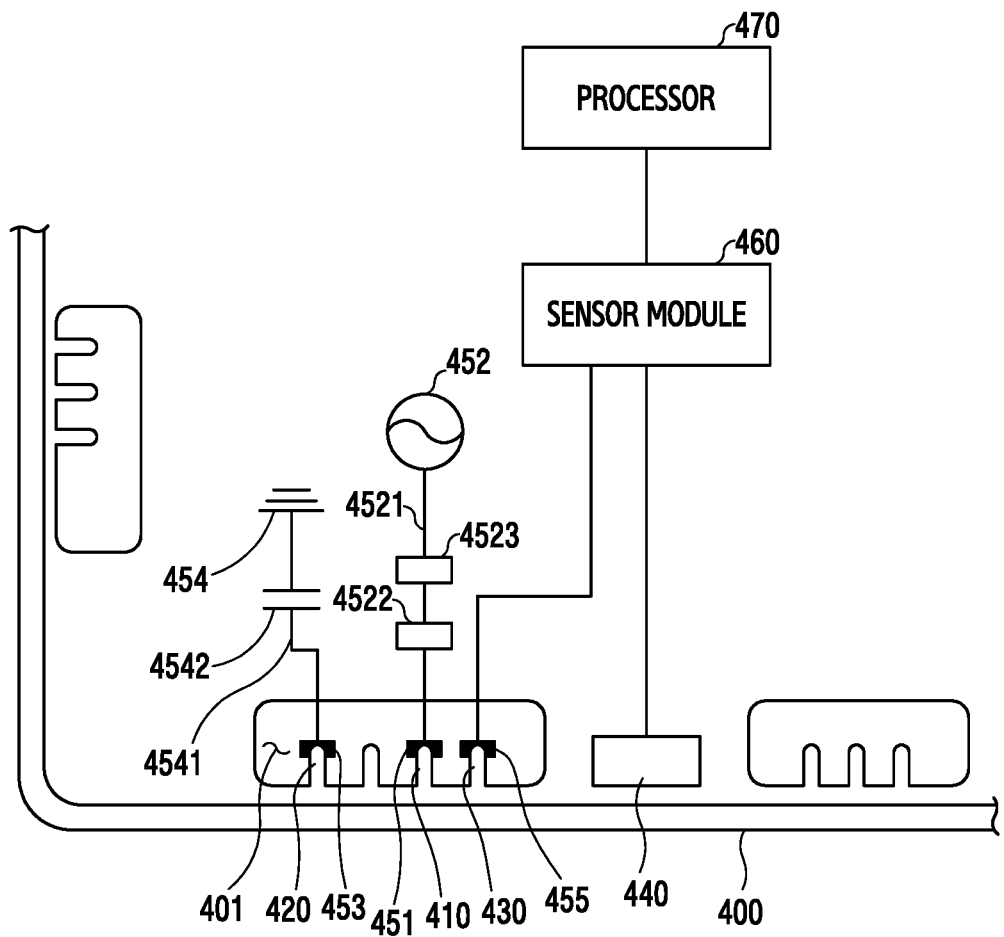
FIG. 4B illustrates a structure of an antenna device according to various embodiments of the present disclosure.

FIG. 4A illustrates a structure of a first conductive member 400 according to various embodiments of the present disclosure. FIG. 4B illustrates a structure of an antenna device according to various embodiments of the present disclosure.

The first conductive member 400 of FIG. 4A and FIG. 4B may be similar to a first conductive member applied to the electronic device 300 of FIG. 3, or may be an embodiment of another first conductive member.

Referring to FIG. 4A and FIG. 4B, the first conductive member 400 may be constructed substantially to have the same area as the total area of the electronic device. However, without being limited thereto, the first conductive member 400 may be configured to have an area disposed in some regions of the electronic device. According to an embodiment, the first conductive member 400 may be used for rigidity enforcement of the electronic device. According to an embodiment, the first conductive member 400 may be contributed as a metal bracket to support a display of the electronic device. According to an embodiment, an edge of the first conductive member 400 may be disposed to be at least partially exposed to the outside of the electronic device, thereby facilitating to improve a good external appearance of the electronic device.

According to various embodiments, the first conductive member 400 may be used as an antenna radiator in at least some regions of the electronic device. According to an embodiment, a region used as the antenna radiator in the first conductive member 400 may be used also as a second conductive member. According to an embodiment, the first conductive member 400 may be used as a grip sensor. According to an embodiment, a slot 401 having a length may be constructed along the edge of the first conductive member 400, and at least some regions of the first conductive member 400 may be contributed as a slot antenna by the slot 401.

According to various embodiments, the first conductive member 401 may be used as a slot antenna by using any one of a plurality of slots 401, 402, 403, 404, 405, and 406. According to an embodiment, as shown in FIG. 4A, a slot antenna region of the first conductive member 400 may be electrically coupled to a sensor module 460 of the electronic device.

According to various embodiments of the present disclosure, the electronic device may further include a separate second conductive member 440 electrically coupled to the sensor module 460 while the first conductive member 400 around the slot antenna is electrically coupled to the sensor module 460. According to an embodiment, the second conductive member 440 may be disposed to a region C or region D which is a neighboring region of the slot 401 contributed as the slot antenna. According to an embodiment, the second conductive member 440 may include a dummy pattern including a specific metal pattern. However, the second conductive member 440 is not limited to the dummy pattern, and thus a metal body having various shapes may be disposed to a corresponding region. According to an embodiment, an electronic device (e.g., a processor) may detect a capacitance variation caused by the first conductive member 440 contributed as the slot antenna and the separate second conductive member 440 through the sensor module, and may perform various functions depending on the detected capacitance variation. Hereinafter, an antenna device will be described in detail.

According to various embodiments, the first conductive member 400 may include the slot 401 to operate as a slot antenna in some regions. According to an embodiment, a plurality of protruding pieces 410, 420, and 430 may be constructed in the slots 401 in a slot direction at an edge of the first conductive member. According to an embodiment, the plurality of protruding pieces may include the feeding piece 410, the grounding piece 420, and the sensor module connecting piece 430. According to an embodiment, the protruding pieces 410, 420, and 430 may be constructions for constructing an antenna pattern. According to an embodiment, the protruding pieces 410, 420 and 430 are electrically coupled to a substrate, but are not limited thereto. For example, corresponding connecting elements (e.g., a feeding portion, a grounding portion, etc.) of the substrate may be electrically coupled directly around a slot or edge of the first conductive member 400 without a structure of the protruding piece.

According to various embodiments, the feeding piece 410 may be fed to a feeding portion 452 of a substrate (or PCB) 450. According to an embodiment, the feeding piece 410 constructed on the first conductive member 400 may be coupled to the feeding portion 452 of the substrate 450 only by an operation of disposing the substrate 450 to the electronic device, or may be electrically coupled by means of a separate electrical connecting member (e.g., a C-clip, a conductive spring, etc.).

According to various embodiments, a feeding pad 451 may be disposed to the substrate 450, and the feeding pad 451 may be electrically coupled to the feeding piece 410 of the first conductive member 400. According to an embodiment, a first electrical path (e.g., a wiring line) 4521 may be constructed from the feeding pad 451 to the feeding portion 452 of the substrate 450. According to an embodiment, the first electrical path 4521 is configured such that the feeding pad 451 of the substrate 450 is electrically in contact directly with the first conductive member 400 constituting an exterior of the electronic device in the first electrical path 4521. Therefore, an electric shock preventing circuit 4522 provided for electric shock prevention and Electro-Static Discharge (ESD) and a matching circuit 4523 for tuning a slot antenna to a desired frequency band may be further included.

According to various embodiments, the first conductive member 400 may include the grounding piece 420 spaced apart from the feeding piece 410 by a specific distance. According to an embodiment, the grounding piece 420 may be grounded to a grounding portion 454 of the substrate 450. According to an embodiment, the grounding piece 420 of the first conductive member 400 may be grounded to the grounding portion 454 of the substrate 450 only by an operation of disposing the substrate 450 to the electronic device, or may be electrically coupled by means of a separate electrical connecting member (e.g., a C-clip, a conductive spring, etc.). According to an embodiment, the first conductive member 400 may be constructed to the outside along an edge of a bracket, and may include an inner bracket including a slot.

According to various embodiments, a grounding pad 453 may be disposed to the substrate 450, and the grounding pad 453 may be electrically coupled to the grounding piece 420 of the first conductive member 400. According to an embodiment, a second electrical path (e.g., a wiring line) 4541 may be constructed from the grounding pad 453 to the grounding portion 454. According to an embodiment, the second electrical path 4541 is configured such that the grounding pad 453 of the substrate 450 is electrically in contact directly with the first conductive member 400 constituting the exterior of the electronic device 453. Therefore, a second electric shock preventing circuit 4542 (e.g., a capacitor) provided for electric shock prevention and Electro-Static Discharge (ESD) may be further included.

According to various embodiments, the sensor module connecting piece 430 may be electrically coupled to the sensor module 460 of the substrate 450. According to an embodiment, the sensor module connecting piece 430 is electrically coupled to a sensor module connecting pad 455 of the substrate 450 only by the operation of disposing the substrate 450 to the electronic device (e.g., a C-clip, a conductive spring, etc.).

According to various embodiments, the second conductive member 440 may be disposed around the slot 401 of the first conductive member 400 used as a slot antenna. According to an embodiment, the second conductive member 440 may also be electrically coupled to the sensor module 460.

According to various embodiments, the electronic device may include the sensor module 460 controlled by a processor 470. According to an embodiment, the sensor module 460 may be electrically coupled to a slot antenna region of the first conductive member 400 and the second conductive member 440 provided separately from the first conductive member 400. For example, the first conductive member 400 may be used as a second conductive member in addition to the antenna radiator.

According to various embodiments, the sensor module 460 may include a grip sensor module. According to an embodiment, when it is determined that a body is proximate to the electronic device, the processor 470 may operate to perform automatic Specific Absorption Rate (SAR) power limit backoff. According to an embodiment, when the sensor module 460 is used as the grip sensor module to detect an approach of the body, the processor 470 may identify that the body is proximate to the electronic device, may control an antenna tuner or a tuning switch to match a resonance frequency of an antenna device which experiences performance deterioration to a frequency band in which the electronic device performs communication. According to an embodiment, upon detecting the approach of the body, the processor 470 may use another antenna to which the body is not proximate. For example, upon sensing the body approach to the antenna of a slot region currently disposed, the processor 470 may control the electronic device to transmit a signal through the antenna of a slot region disposed to another region of the electronic device.

According to various embodiments, the sensor module 460 may include an electrocardiogram sensor module for checking a heart rate of the body. According to various embodiments, the sensor module 460 may include a temperature sensor module in which the first conductive member 400 and/or the second conductive member 440 serve as a probe. According to various embodiments, the sensor module 460 may include an underwater sensor (an immersion sensor) module for sensing a permittivity of liquid to recognize that it is underwater.

According to various embodiments, upon detecting the body contact to the electronic device, the sensor module 460 may detect a capacitance variation based on the first conductive member 400. According to an embodiment, upon detecting the body contact to the electronic device, the sensor module 460 may detect the capacitance variation based on the second conductive member 440.

According to various embodiments, the processor 470 may detect the capacitance variation based on the body contact across the entire region of the electronic device through the sensor module 460 by means of the first conductive member 400. According to various embodiments, the processor 470 may detect the capacitance variation based on the body contact in a specific region (a region in which the second conductive member disposed around the slot antenna is disposed) of the electronic device through the sensor module 460 by means of the second conductive member. Therefore, the electronic device may determine whether the body contact is made in a region around the antenna of the electronic device or is made in the other regions.

According to various embodiments, the electronic device may determine a location of a body contact made on the electronic device by detecting a total capacitance variation or individual variation of at least two members (a first conductive member and a second conductive member) used as a sensor. According to an embodiment, when it is detected that the capacitance variation based on the body contact is greater than or equal to a preset threshold, the electronic device may decrease Tx power by identifying that the body is in contact with a slot antenna region. For example, the sensor module 460 may detect the capacitance variation in the first conductive member 400 and the second conductive member 440. According to an embodiment, when it is detected that the capacitance variation based on the body contact is less than or equal to the preset threshold, the electronic device may maintain the Tx power of the slot antenna without alternation by identifying that the body is in contact with the other slot antenna regions. For example, the sensor module 460 may detect only the capacitance variation of the first conductive member 400.

According to various embodiments, the electronic device may maintain TX power upon sensing the body contact in a region other than the slot antenna region. According to an embodiment, upon sensing the body contact in a specific region among regions other than the slot antenna region, the electronic device may detect a capacitance variation of a corresponding region of the first conductive member by means of the sensor module, and may perform a corresponding function by comparing the detected capacitance variation with a table stored in a memory of the electronic device. According to an embodiment, the corresponding function may execute at least one application program only by touching a specific external region of the electronic device by the user. According to an embodiment, the electronic device may execute a camera program or capture a subject only by touching a specific external region of the electronic device.

Figure 5:
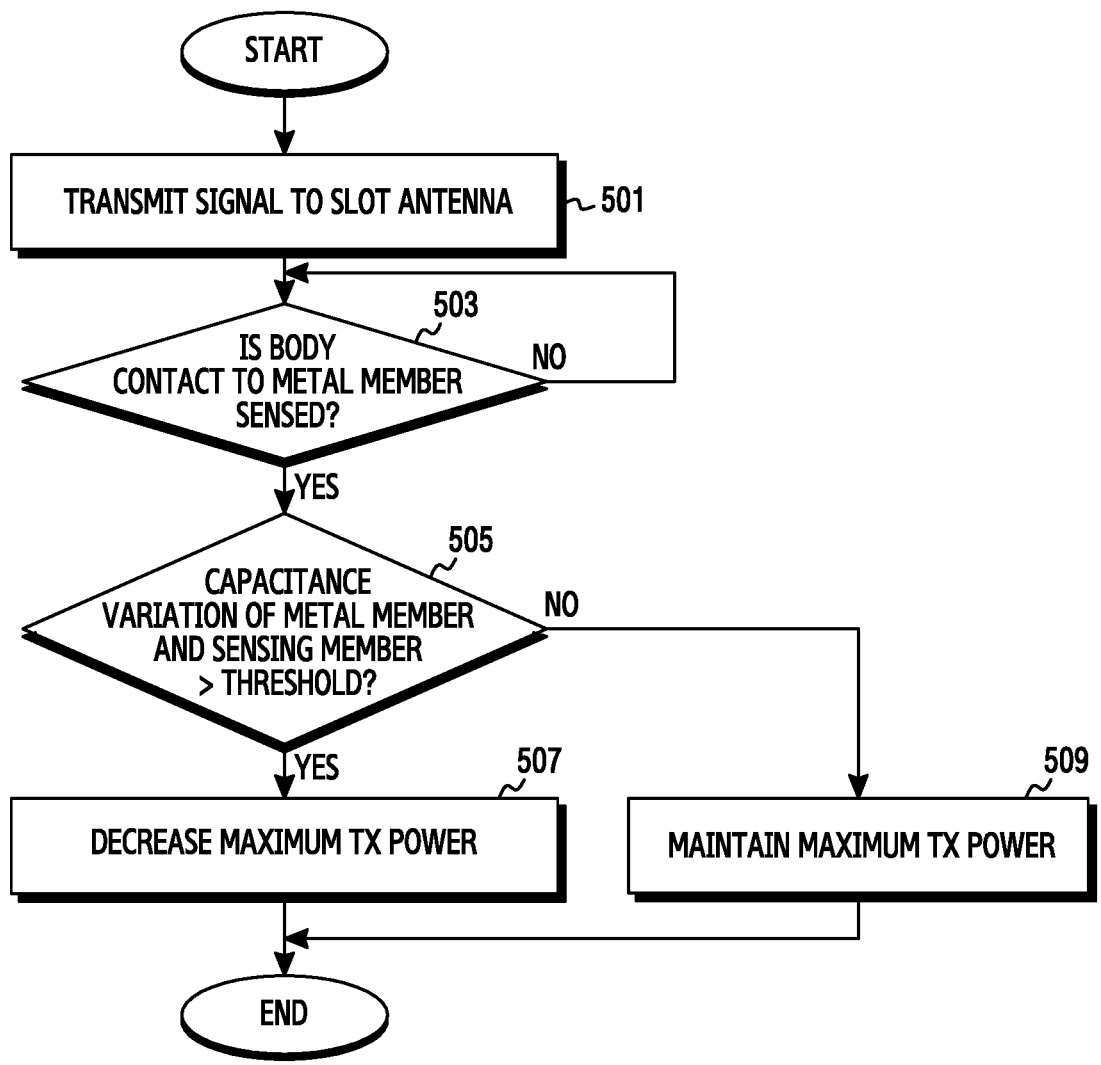
FIG. 5 is a flowchart illustrating a sensing function of an electronic device when a body is in contact with a first conductive member according to various embodiments of the present disclosure.

FIG. 5 is a flowchart illustrating a sensing function of an electronic device when a body is in contact with a first conductive member according to various embodiments of the present disclosure.

Referring to FIG. 5, in operation 501, an operation of transmitting a signal to a slot antenna may be performed. According to an embodiment, a first conductive member may include a slot having a length, and may transmit a signal by means of a slot antenna constructed by the slot. According to an embodiment, at least two functions may be performed in an antenna region of the first conductive member. According to an embodiment, the first conductive member may be utilized as a first function (e.g., a function of transmitting/receiving a signal by a slot antenna, or the like). According to an embodiment, the first conductive member may perform a second function (e.g., a sensing function (e.g., a grip sensing function, an electrocardiogram sensing function, a general touch sensing function, a temperature sensing function, an underwater sensing function, or the like)).

In operation 503, an operation of detecting a body contact to the first conductive member may be performed. According to an embodiment, the electronic device may detect the capacitance variation depending on the first conductive member. According to an embodiment, the electronic device may detect the capacitance variation of the second conductive member while detecting the capacitance variation of the first conductive member. According to an embodiment, the electronic device may individually or collectively detect the capacitance variation of the first conductive member and the capacitance variation of the second conductive member. According to an embodiment, the electronic device may detect the capacitance variation based on the body contact across the entire region of the electronic device through the sensor module by means of the first conductive member. According to an embodiment, the electronic device may detect the capacitance variation based on the body contact in a specific region (a region in which the second conductive member disposed around the slot antenna is disposed) of the electronic device through the sensor module by means of the second conductive member. Therefore, the electronic device may determine whether the body contact is made in a region around the antenna of the electronic device or is made in the other regions.

In operation 505, upon detecting the body contact to the first conductive member, the electronic device may perform an operation of determining whether the capacitance variation detected by the first conductive member and the second conductive member is greater than a preset threshold. According to an embodiment, the electronic device may detect a total capacitance variation or individual capacitance variation of the first conductive member and the second conductive member.

In operation 507, when it is detected that the capacitance variation based on the body contact is greater than or equal to the preset threshold, the electronic device may decrease Tx power by identifying that the body is in contact with a slot antenna region.

In operation 509, when it is detected that the capacitance variation based on the body contact is less than or equal to the preset threshold, the electronic device may maintain the Tx power of the slot antenna without alternation by identifying that the body is in contact with the other slot antenna regions. In this case, the sensor module may detect only the capacitance variation of the first conductive member.

Figure 6A:
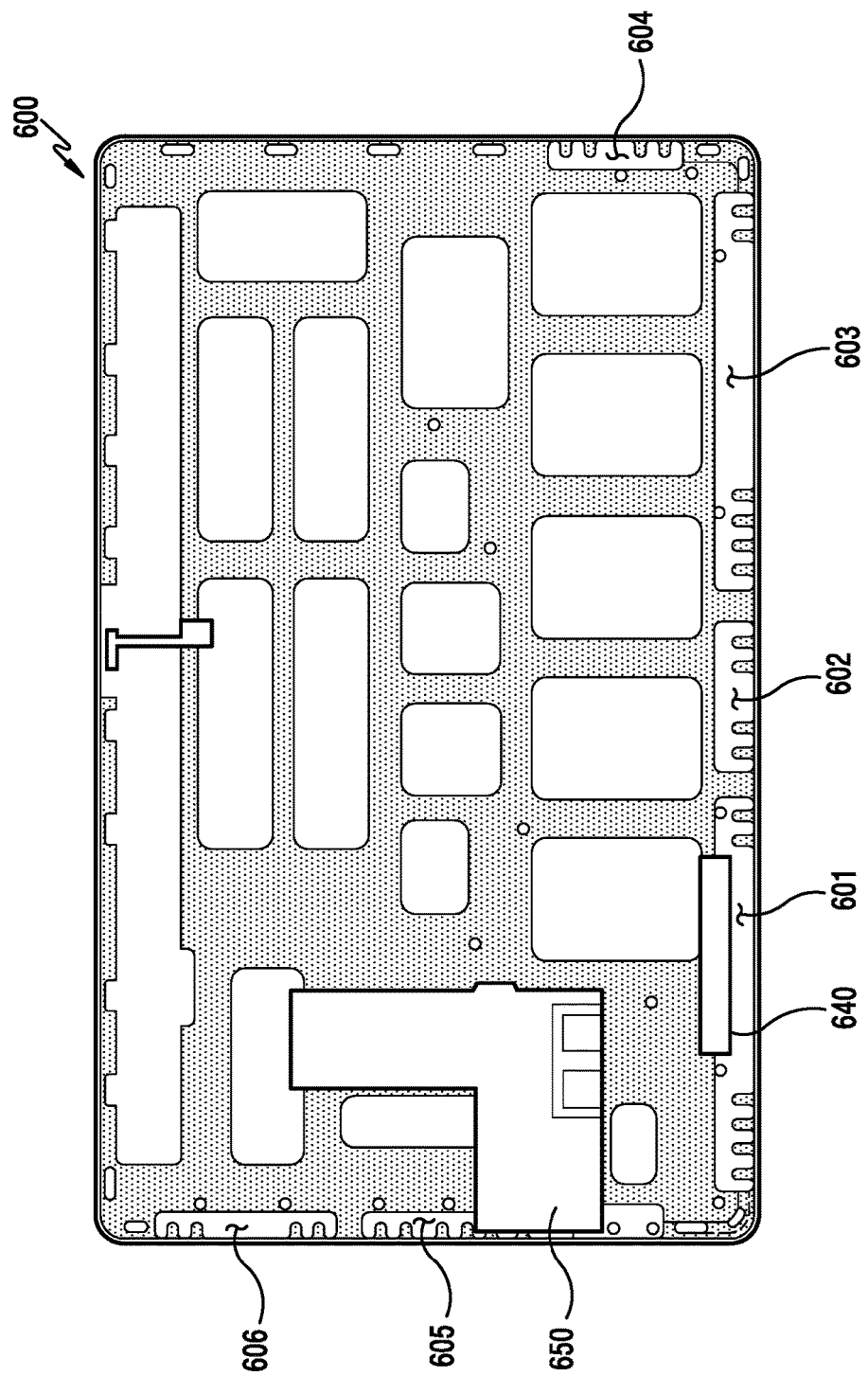
FIG. 6A illustrates a structure of a first conductive member according to various embodiments of the present disclosure.
Figure 6B:
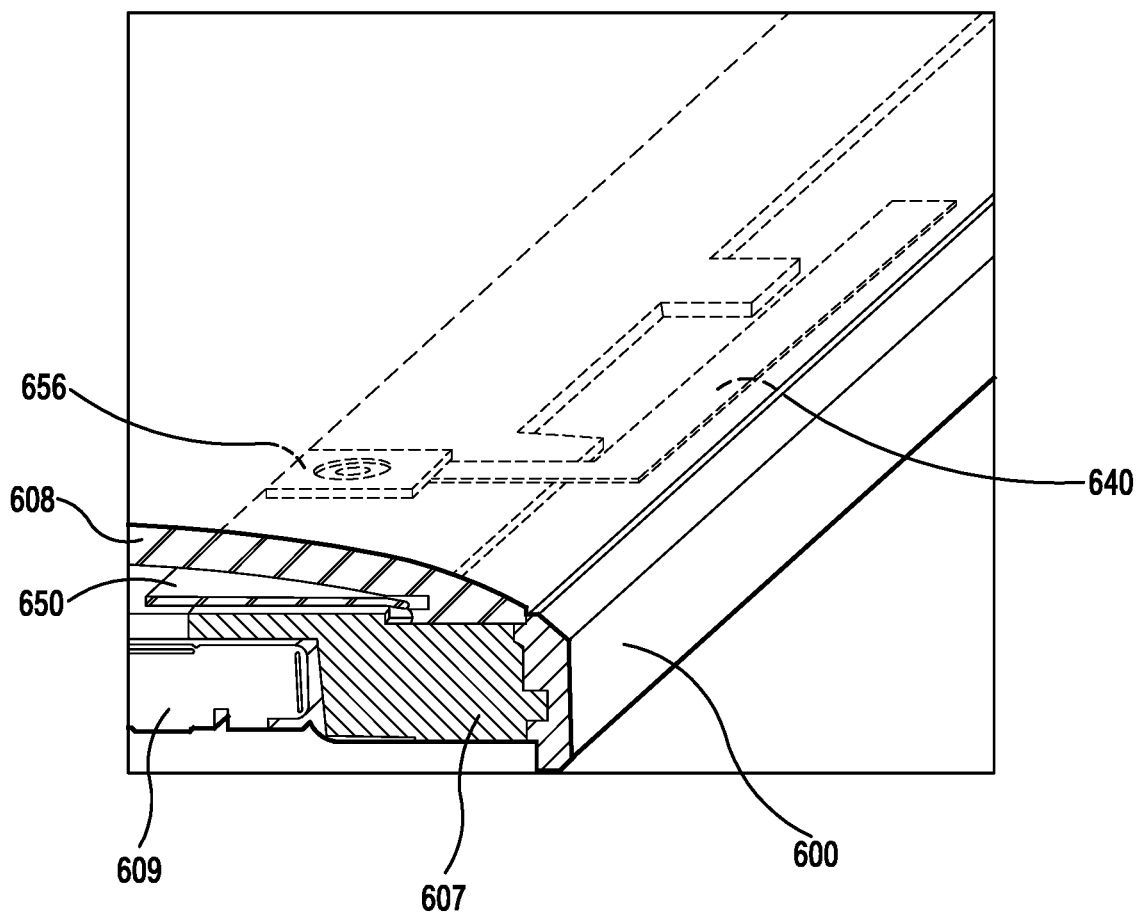
FIG. 6B is a perspective view illustrating an important part of a state in which a second conductive member is disposed around a first conductive member according to various embodiments of the present disclosure.

FIG. 6A illustrates a structure of a first conductive member 600 according to various embodiments of the present disclosure. FIG. 6B is a perspective view illustrating an important part of a state in which a second conductive member 640 is disposed around a first conductive member according to various embodiments of the present disclosure.

Figure 6C:
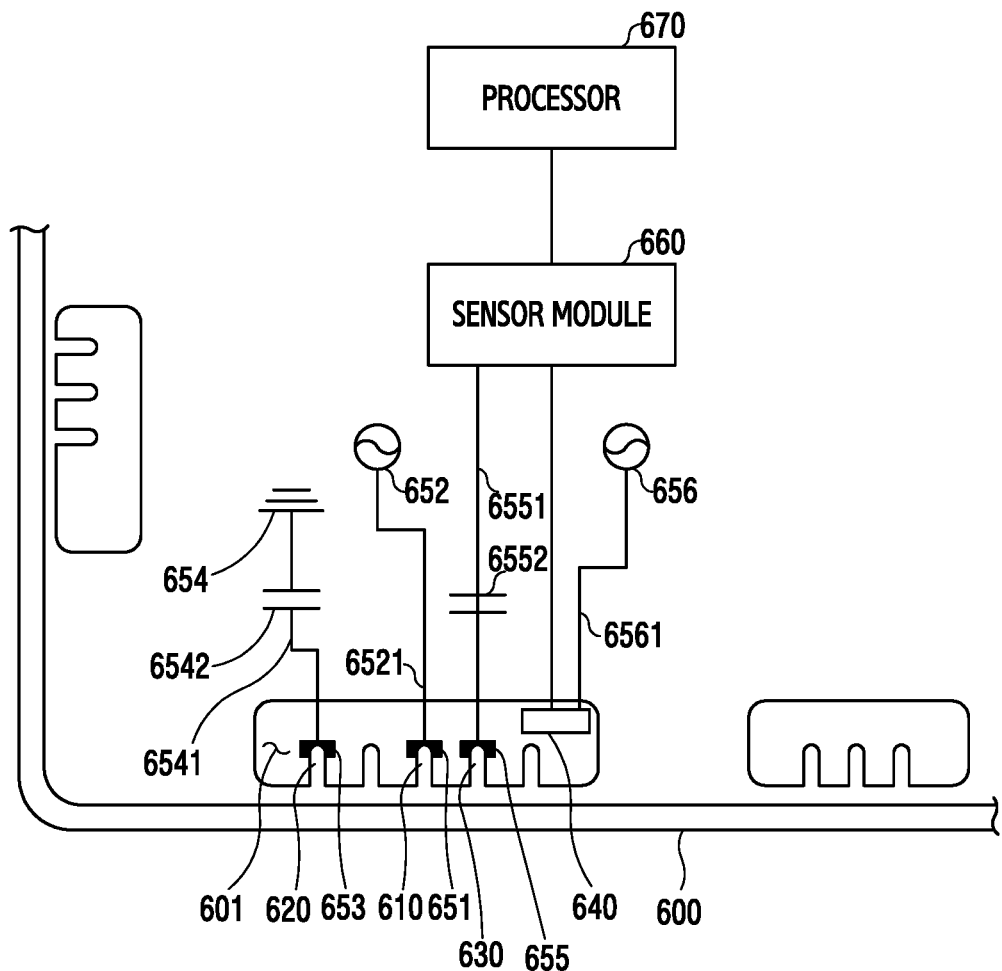
FIG. 6C illustrates an antenna device according to various embodiments of the present disclosure.

FIG. 6C illustrates an antenna device according to various embodiments of the present disclosure.

The first conductive member 600 of FIG. 6A to FIG. 6C may be similar to a first conductive member applied to the electronic device 300 of FIG. 3, or may be an embodiment of another first conductive member. The first conductive member 600 of FIG. 6A to FIG. 6C may be similar to the first conductive member 400 of FIG. 4A, or may be an embodiment of another first conductive member.

Referring to FIG. 6A to FIG. 6C according to various embodiments of the present disclosure, the first conductive member 600 may be constructed substantially to have the same area as the total area of the electronic device. However, without being limited thereto, the first conductive member 600 may be configured to have an area disposed in some regions of the electronic device. According to an embodiment, the first conductive member 600 may be used for rigidity enforcement of the electronic device. According to an embodiment, the first conductive member 600 may be contributed as a metal bracket to support a display of the electronic device. According to an embodiment, an edge of the first conductive member 600 may be disposed to be at least partially exposed to the outside of the electronic device, thereby facilitating to improve a good external appearance of the electronic device.

According to various embodiments, the first conductive member 600 may be used as an antenna radiator in at least some regions of the electronic device. According to an embodiment, a corresponding region may operate as a slot antenna by a slot 601 constructed in a lengthwise direction in a specific region of the first conductive member 600. According to an embodiment, the slot 601 having a length may be constructed along the edge of the first conductive member 600, and may be contributed as a slot antenna by the slot 601.

According to various embodiments, the electronic device may include the second conductive member 640 disposed separately around the slot antenna. According to an embodiment, the second conductive member 640 may include a conductive pattern. According to an embodiment, the second conductive member 640 may be contributed as a sensor while being utilized as an antenna radiator. According to an embodiment, the second conductive member 640 may be contributed as a grip sensor. According to an embodiment, the slot antenna may not be free to design the pattern due to a mechanically limited structure. Therefore, it may not be easy to implement a multi-band frequency, and thus the slot antenna may be implemented to operate in a low band of 700 MHz to 900 MHz and a mid band of 1700 MHz to 2100 MHz. According to an embodiment, the second conductive member 640 may be implemented to operate in a high band from 2300 MHz to 2700 MHz. In this case, the slot antenna of the first conductive member 600 may be electrically coupled to a first feeding portion (652 of FIG. 6C) of a substrate 650. According to an embodiment, the second conductive member 640 may be electrically coupled to a second feeding portion 656 of the substrate 650.

Referring to FIG. 6B, the first conductive member 600 may be disposed to be exposed to at least some regions of the electronic device by an injection member 607 which supports a display 609 in the electronic device. According to an embodiment, the first conductive member 600 may be electrically coupled to the feeding portion (652 of FIG. 6C) of the substrate 650. According to an embodiment, the second conductive member 640 may be spaced apart from the first conductive member 600. According to an embodiment, the second conductive member 640 may be disposed around a slot region for the first conductive member 600. According to an embodiment, the second conductive member 640 may be a Flexible Printed Circuit Board (FPCB) including an antenna pattern. However, without being limited thereto, it may be a metal plate having a pattern shape. According to an embodiment, the second conductive member 640 may be a metallic ornamental member disposed to be exposed to the outside of the electronic device. According to an embodiment, the second conductive member 640 may be disposed at various locations of the electronic device. According to an embodiment, the second conductive member 640 may be disposed to be attached to an inner surface of a rear housing 608 of the electronic device. According to an embodiment, the second conductive member 640 may be disposed in such a manner that a conductive paint is applied to the inner surface of the rear housing 608 of the electronic device. In this case, the second conductive member 640 may be electrically coupled to the sensor module 660 and the second feeding portion 656 of the substrate 650 by a separate electrical connecting member. According to an embodiment, the second conductive member may include a pattern shape to be used as an antenna. According to an embodiment, an electrical connecting member may include an FPCB, a metal wire, or the like.

Referring to FIG. 6C, the first conductive member 600 may include the slot 601 to operate as a slot antenna in some regions. According to an embodiment, a plurality of protruding pieces 610, 620, and 630 may be constructed in the slots 601 in a slot direction at the edge of the first conductive member 600. According to an embodiment, the plurality of protruding pieces may include the feeding piece 610, the grounding piece 620, and the sensor module connecting piece 630. According to an embodiment, the protruding pieces 610, 620, and 630 may be constructions for constructing an antenna pattern. According to an embodiment, the protruding pieces 610, 620 and 630 are electrically coupled to a substrate, but are not limited thereto. For example, corresponding connecting elements (e.g., a feeding portion, a grounding portion, etc.) of the substrate may be electrically coupled directly around a slot or edge of the first conductive member 600 without a structure of the protruding piece.

According to various embodiments, the feeding piece 610 may be fed to a feeding portion 652 of the first substrate 650. According to an embodiment, the feeding piece 610 constructed on the first conductive member 600 may be coupled to the feeding portion 652 of the substrate 650 only by an operation of disposing the substrate 650 to the electronic device, or may be electrically coupled by means of a separate electrical connecting member (e.g., a C-clip, a conductive spring, etc.).

According to various embodiments, a feeding pad 651 may be disposed to the substrate 650, and the feeding pad 651 may be electrically coupled to the feeding piece 610 of the first conductive member 600. According to an embodiment, a first electrical path (e.g., a wiring line) 6521 may be constructed from the feeding pad 651 to the feeding portion 652 of the substrate 650. According to an embodiment, the first electrical path 6521 is configured such that the feeding pad 651 of the substrate 650 is electrically in contact directly with the first conductive member 600 constituting an exterior of the electronic device in the first electrical path 6521. Therefore, an electric shock preventing circuit provided for electric shock prevention and Electro-Static Discharge (ESD) and a matching circuit for tuning a slot antenna in a desired frequency band may be further included.

According to various embodiments, the first conductive member 600 may include the grounding piece 620 spaced apart from the feeding piece 610 by a specific distance. According to an embodiment, the grounding piece 620 may be grounded to a grounding portion 654 of the substrate 650. According to an embodiment, the grounding piece 620 of the first conductive member 600 may be grounded to the grounding portion 654 of the substrate 650 only by an operation of disposing the substrate 650 to the electronic device, or may be electrically coupled by means of a separate electrical connecting member (e.g., a C-clip, a conductive spring, etc.).

According to various embodiments, a grounding pad 653 may be disposed to the substrate 650, and the grounding pad 653 may be electrically coupled to the grounding piece 620 of the first conductive member 600. According to an embodiment, a second electrical path (e.g., a wiring line) 6541 may be constructed from the grounding pad 653 to the grounding portion 654. According to an embodiment, a second electrical path 6541 is configured such that the grounding pad 653 of the substrate 650 is electrically in contact directly with the first conductive member 600 constituting the exterior of the electronic device 653. Therefore, a second electric shock preventing circuit 6542 (e.g., a capacitor) provided for electric shock prevention and Electro-Static Discharge (ESD) may be further included.

According to various embodiments, the sensor module connecting piece 630 may be electrically coupled to a sensor module 660 of the substrate 650. According to an embodiment, the sensor module connecting piece 630 is electrically coupled to a sensor module connecting pad 655 of the substrate 650 only by the operation of disposing the substrate 650 to the electronic device (e.g., a C-clip, a conductive spring, etc.).

According to various embodiments, the sensor module connection pad 655 may be electrically coupled to the sensor module 660 by a third electrical path 6551. According to an embodiment, a capacitor 6552 may be included in a third electrical path. According to an embodiment, the capacitor 6522 may have a capacitance value of at least 100 pF. According to an embodiment, a capacitor arrangement structure of a third electrical path 6551 may operate as an open circuit which is not electrically coupled to the sensor module 660 when a body is in contact with the first conductive member 600 in a region other than a region around the second conductive member 640. Therefore, the processor 670 may detect a body contact only in a region (a slot antenna arrangement region) in which the second conductive member 640 of the electronic device is disposed.

According to various embodiments, the second conductive member 640 may be disposed around the first conductive member 600 used as a slot antenna. According to an embodiment, the second conductive member 640 may be disposed at a location overlapping with the slot 601. However, without being limited thereto, the second conductive member 640 may be disposed around the slot 601 without overlapping with the slot 601. According to an embodiment, the second conductive member 640 may also be electrically coupled to the sensor module 660 and the second feeding portion 656.

Figure 7A:
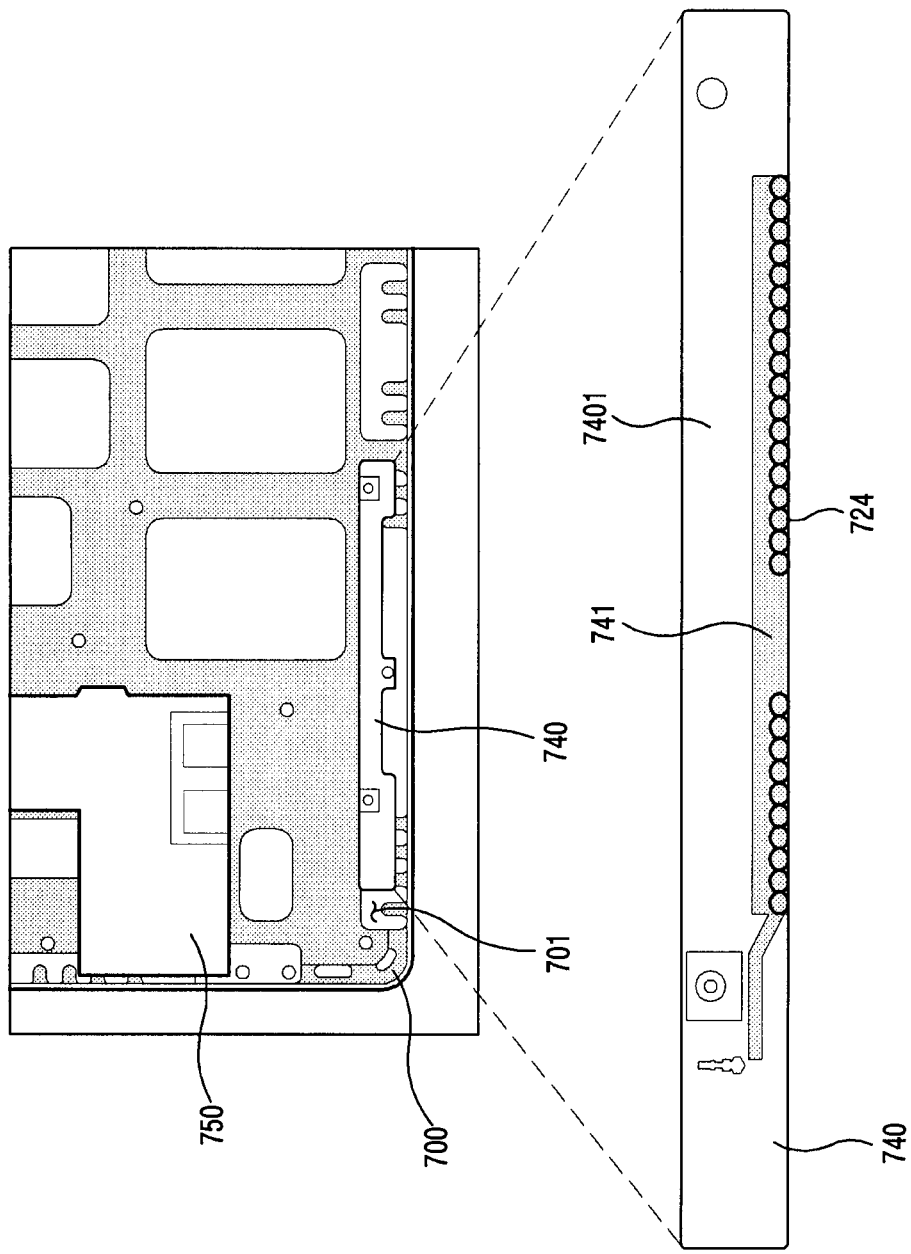
FIG. 7A illustrates a state in which a second conductive member is disposed around a first conductive member according to various embodiments of the present disclosure.
Figure 7B:
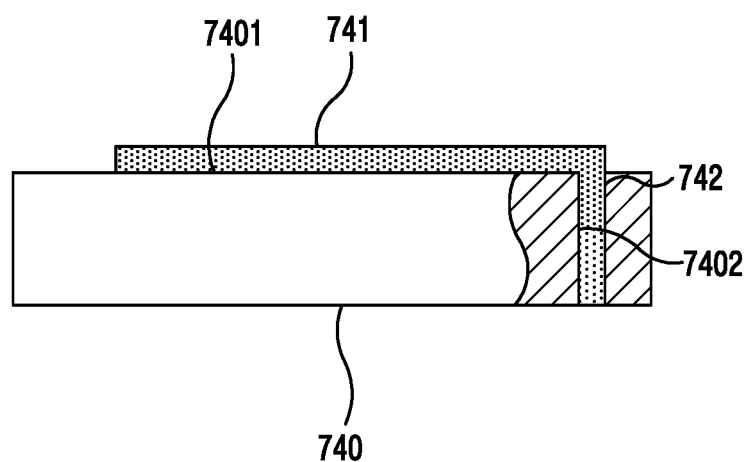
FIG. 7B is a cross-sectional view of a substrate of FIG. 7A according to various embodiments of the present disclosure.

FIG. 7A illustrates a state in which a second conductive member 740 is disposed around a first conductive member according to various embodiments of the present disclosure. FIG. 7B is a cross-sectional view of the substrate 740 (e.g., PCB) of FIG. 7A according to various embodiments of the present disclosure.

A first conductive member 700 of FIG. 7A may be similar to the first conductive member applied to the electronic device 300 of FIG. 3, or may be an embodiment of another first conductive member. The first conductive member 700 of FIG. 7A may be similar to the first conductive members 400 and 600 of FIG. 4A and FIG. 6A, or may be an embodiment of another first conductive member.

Referring to FIG. 7A, the first conductive member 700 may include a slot 701. According to an embodiment, at least some regions in which the slot 701 of the first conductive member 700 is included may be contributed as a slot antenna. According to an embodiment, the substrate (e.g., PCB) 740 may be included around the slot 701 contributed as the slot antenna. According to an embodiment, a conductive pattern 741 having a specific shape may be constructed in the substrate 740. According to an embodiment, the substrate 740 may be a sub-substrate (e.g., a sub-PCB) provided separately from a main substrate 750 of the electronic device. However, without being limited thereto, a pattern may be directly constructed on the main substrate 750 when a space is allowed in the electronic device.

According to various embodiments, when the conductive pattern 741 constructed on the substrate 740 is used only as a dummy pattern for the sensor, it may perform the same function as the second conductive member 440 of FIG. 4A and FIG. 4B. In this case, each of the first conductive member 700 and the conductive pattern 741 may be electrically coupled to the sensor module. According to an embodiment, when the conductive pattern 741 constructed on the substrate 740 is used also as an antenna radiator and a second conductive member, it may perform the same function as the second conductive member 640 of FIG. 6A to FIG. 6C.

According to various embodiments, a plurality of vias 724 may be constructed in a first side 7401 having the conductive pattern of the substrate. According to an embodiment, the plurality of vias 724 may allow the second conductive member 740 to facilitate sensitivity improvement in various directions due to the first conductive pattern 741 disposed to the first side 7401 (e.g., an upper side) constructed in a first direction of the substrate 740 and a second conductive pattern 742 disposed by being extended up to a second side 7402 formed in a second direction different from the first direction of the substrate 740. According to an embodiment, a conductive pattern may be constructed by forming, attaching, and applying a metal member (e.g., applying of a conductive paint or the like) in a lateral side of the substrate. According to various embodiments, there may be provided an electronic device including a housing having a plurality of sides, a first conductive member constructing at least part of the plurality of sides, a second conductive member disposed inside the housing, a first sensor circuit which provides a first output indicating a first capacitance value related to the first conductive member and/or a change to the first capacitance value, a second sensor circuit which provides a second output indicating a second capacitance value related to the second conductive member and/or a change to the second capacitance value, and a control circuit which receives the first and second outputs from the first and second sensor circuits.

According to various embodiments, the control circuit may include a processor and a memory. The memory may store an instruction for identifying by the processor whether the housing around the second conductive member is partially in contact with an external object on the basis of at least part of the first and second outputs when executed.

According to various embodiments, the housing may include a first side, a second side facing the first side, and a lateral side surrounding a space between the first side and the second side. The first conductive member may be extended to the entirety of the lateral side. The second conductive member may be extended along not the entirety but part of the lateral side.

According to various embodiments, there may be provided an electronic device including a housing, a first conductive member constructing at least part of the housing or disposed at least partially inside the housing, a communication circuit electrically coupled to the first conductive member, a second conductive member disposed to be separated from the first conductive member, a sensor module electrically coupled to the first conductive member and the second conductive member, and at least one processor which controls the electronic device to perform a corresponding function upon detecting an external object by the sensor module.

According to various embodiments, the first conductive member may include at least one slot. At least one region of the first conductive member may be electrically coupled to the communication circuit to operate as a slot antenna radiator.

According to various embodiments, the first conductive member may operate as a slot antenna radiator depending on at least one slot. At least one region of the first conductive member may be electrically coupled to the sensor module.

According to various embodiments, the sensor module may be a sensor module which detects a capacitance variation based on a contact of a body in proximity to the first conductive member and the second conductive member.

According to various embodiments, the processor may perform a first function when the capacitance variation detected by the sensor module is greater than or equal to a preset threshold, and may perform a second function when it is less than or equal to the threshold.

According to various embodiments, the first function may include a Transmit (Tx) power back-off function of the conductive member electrically coupled to the communication circuit to operate as an antenna radiator.

According to various embodiments, the second function may include a function for controlling an application program executed in the electronic device.

According to various embodiments, the second conductive member may be at least one of a conductive pattern and metal body having a specific shape and constructed in a dielectric material.

According to various embodiments, the second conductive member may be constructed with a conductive pattern on a substrate (or a Printed Circuit Board (PCB)) having the communication circuit, or may be attached to an inner surface of the housing as a Flexible Printed Circuit Board (FPCB) or a metal body, or may be applied to the inner surface of the housing with a conductive paint, or may be disposed as an ornamental member separated from the first conductive member.

According to various embodiments, the second conductive member may be extended to a lateral side of the substrate by a plurality of vias constructed on the substrate when disposed to the substrate or the PCB as a pattern.

According to various embodiments, there may be provided an electronic device including a housing, a first conductive member constructing at least part of the housing or disposed at least partially inside the housing, a communication circuit electrically coupled to the first conductive member, a second conductive member disposed to be separated from the first conductive member, a sensor module electrically coupled to the first conductive member and the second conductive member, and at least one processor which controls the electronic device to perform a corresponding function upon detecting an external object by the sensor module.

According to various embodiments, the first conductive member may include at least one slot. At least one region of the first conductive member may be electrically coupled to the communication circuit to operate as a slot antenna radiator.

According to various embodiments, the second conductive member may be electrically coupled to the communication circuit to operate as an antenna radiator together with the first conductive member.

According to various embodiments, an operating frequency band of the second conductive member may operate in a band higher than the operating frequency band of the first conductive member.

According to various embodiments, the sensor module may be a sensor module which detects a capacitance variation based on a contact of a body in proximity to the first conductive member and the second conductive member.

According to various embodiments, at least one capacitor may be disposed to exclude a sensing function of the first conductive member in an electrical path which connects the first conductive member and the sensor module.

According to various embodiments, a method of operating an electronic device including a first conductive member coupled to a communication circuit and a second conductive member disposed around the first conductive member and coupled to a sensor module together with the first conductive member may include detecting a capacitance variation based on a contact of an external object in proximity to the electronic device, performing a first function when the capacitance variation detected by the sensor module is greater than or equal to a preset threshold, and performing a second function when it is less than or equal to the threshold.

According to various embodiments the performing of the first function may include a Transmit (Tx) power back-off operation of the conductive member electrically coupled to the communication circuit to operate as an antenna radiator.

According to various embodiments, the performing of the second function may include controlling an application program executed in the electronic device.

According to various embodiments, the performing of the second function may include identifying a corresponding function based on the detected capacitance variation and a capacitance variation previously stored in the electronic device, and performing the identified corresponding function.

Various exemplary embodiments of the present disclosure disclosed in the specification and the drawing are merely a specific example presented for clarity and are not intended to limit the scope of the present disclosure. Therefore, in addition to the embodiments disclosed herein, various changes in forms and details made without departing from the technical concept of the present disclosure will be construed as being included in the scope of the present disclosure.

What is claimed is:

1. An electronic device comprising:
   a housing having a plurality of sides;
   a first conductive member constructing at least part of the plurality of sides;
   a second conductive member disposed inside the housing;

a sensor module configured to detect a first capacitance value related to the first conductive member and a second capacitance value related to the second conductive member; and at least one processor configured to receive the first capacitance value and the second capacitance value from the sensor module, wherein the first conductive member comprises a slot to operate as a slot antenna, the slot being constructed along an edge of the first conductive member, and wherein a plurality of protruding pieces are constructed in the slot, the plurality of protruding pieces protruding from the edge of the first conductive member in a slot direction and including a first protruding piece electrically coupled with a feeding part, a second protruding piece electrically coupled with a ground part and a third protruding piece electrically coupled with the sensor module.

2. The electronic device of claim 1, wherein the at least one processor is further configured to identify whether the housing around the second conductive member is partially in contact with an external object based on the first capacitance value and the second capacitance value.

3. The electronic device of claim 1, wherein the plurality of sides comprise a first side, a second side facing the first side, and a lateral side surrounding a space between the first side and the second side, wherein the first conductive member is extended to an entirety of the lateral side, and wherein the second conductive member is extended along a partial length of the lateral side.

4. An electronic device comprising:

a housing;

a first conductive member constructing at least part of the housing or disposed at least partially inside the housing;

a communication circuit electrically coupled to the first conductive member;

a second conductive member disposed to be separated from the first conductive member;

a sensor module electrically coupled to the first conductive member and the second conductive member; and at least one processor configured to control the electronic device to perform a corresponding function upon detecting an external object by the sensor module, wherein the first conductive member comprises a slot to operate as a slot antenna, the slot being constructed along an edge of the first conductive member, and wherein a plurality of protruding pieces are constructed in the slot, the plurality of protruding pieces protruding from the edge of the first conductive member in a slot direction and including a first protruding piece electrically coupled with a feeding part, a second protruding piece electrically coupled with a ground part and a third protruding piece electrically coupled with the sensor module.

5. The electronic device of claim 4, wherein the sensor module is configured to detect a capacitance variation based on a contact of the external object in proximity to the first conductive member and the second conductive member.

6. The electronic device of claim 5, wherein the at least one processor is configured to control the electronic device to perform a first function when the capacitance variation detected by the sensor module is greater than or equal to a preset threshold, and configured to control the electronic device to perform a second function when the capacitance variation is less than the preset threshold.

7. The electronic device of claim 6, wherein the first function comprises a Transmit (Tx) power back-off function of the first conductive member electrically coupled to the communication circuit.

8. The electronic device of claim 6, wherein the second function comprises a function for controlling an application program executed in the electronic device.

9. The electronic device of claim 4, wherein the second conductive member is at least one of a conductive pattern and metal body having a specific shape and constructed in a dielectric material.

10. The electronic device of claim 4, wherein the second conductive member is at least one of:

a conductive pattern on a substrate comprising the communication circuit;

a Flexible Printed Circuit Board (FPCB) attached to an inner surface of the housing;

a metal body attached to the inner surface of the housing;

a conductive paint applied to the inner surface of the housing; and an ornamental member disposed to be separated from the first conductive member.

11. The electronic device of claim 10, wherein when the second conductive member is the conductive pattern on the substrate, the second conductive member is extended to a lateral side of the substrate by a plurality of vias constructed on the substrate.

12. The electronic device of claim 4, wherein the second conductive member is electrically coupled to the communication circuit to operate as an antenna radiator together with the first conductive member.

13. The electronic device of claim 12, wherein an operating frequency band of the second conductive member operates in a band higher than the operating frequency band of the first conductive member.

* * * * *